United States Patent
Gabryjelski et al.

(10) Patent No.: US 10,514,969 B2
(45) Date of Patent: Dec. 24, 2019

(54) BIT-ACCURATE-TRACING ANALYSIS WITH APPLIED MEMORY REGION LIFETIMES

(71) Applicant: MICROSOFT TECHNOLOGY LICENSING, LLC, Redmond, WA (US)

(72) Inventors: Henry Gabryjelski, Bellevue, WA (US); Jordi Mola, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/865,699

(22) Filed: Jan. 9, 2018

(65) Prior Publication Data

US 2019/0213065 A1 Jul. 11, 2019

(51) Int. Cl.
| | | |
|---|---|---|
| *G06F 11/00* | (2006.01) | |
| *G06F 11/07* | (2006.01) | |
| *G06F 3/06* | (2006.01) | |
| *G11C 16/34* | (2006.01) | |
| *G06F 11/36* | (2006.01) | |

(52) U.S. Cl.
CPC .......... *G06F 11/008* (2013.01); *G06F 3/0653* (2013.01); *G06F 11/073* (2013.01); *G06F 11/362* (2013.01); *G11C 16/349* (2013.01)

(58) Field of Classification Search
CPC .... G06F 11/008; G06F 3/0653; G06F 11/073; G11C 16/349
See application file for complete search history.

(56) References Cited

U.S. PATENT DOCUMENTS

| | | | | |
|---|---|---|---|---|
| 5,870,607 | A * | 2/1999 | Netzer | G06F 11/3414 714/E11.193 |
| 6,145,121 | A * | 11/2000 | Levy | G06F 11/3461 703/22 |
| 6,560,773 | B1 * | 5/2003 | Alexander, III | G06F 11/3466 707/999.202 |
| 7,958,497 | B1 | 6/2011 | Lindo et al. | |
| 9,122,795 | B1 * | 9/2015 | Daudel | G06F 9/45504 |
| 2007/0011428 | A1 * | 1/2007 | Kurtz | G06F 11/3636 711/171 |
| 2009/0300425 | A1 * | 12/2009 | Gollub | G06F 11/0715 714/42 |
| 2011/0264959 | A1 | 10/2011 | Subhraveti | |

(Continued)

OTHER PUBLICATIONS

"International Search Report and Written Opinion Issued in PCT Application No. PCT/US2018/066103", dated Mar. 20, 2019, 11 Pages.

*Primary Examiner* — Charles Rones
*Assistant Examiner* — Tong B. Vo
(74) *Attorney, Agent, or Firm* — Workman Nydegger

(57) ABSTRACT

Detecting and providing notice of non-faulting memory accesses during prior execution of an application based on a replay-able trace of the application's execution. Embodiments include replaying portion(s) of prior execution of the application from a replay-able trace the application's prior execution, while tracking lifetime of memory region(s) used by the application. Based on tracking lifetime of the memory region, non-faulting but improper memory access(es) by the application during its prior execution are detected. Notification of these non-faulting but improper memory access(es) are provided at a user interface and/or to a software component.

61 Claims, 5 Drawing Sheets

(56) References Cited

U.S. PATENT DOCUMENTS

| | | | | |
|---|---|---|---|---|
| 2012/0278665 A1* | 11/2012 | Serebryany | ........... | G06F 11/073 |
| | | | | 714/53 |
| 2014/0157039 A1* | 6/2014 | Peck | ........................ | G06F 11/07 |
| | | | | 714/2 |
| 2014/0237293 A1* | 8/2014 | Cui | ..................... | G06F 11/3466 |
| | | | | 714/37 |
| 2015/0378870 A1* | 12/2015 | Marron | ................. | G06F 11/362 |
| | | | | 717/128 |
| 2016/0335172 A1* | 11/2016 | Smith | ................. | G06F 11/3644 |

* cited by examiner

600

```
struct A {
    int64_t  a;
    int64_t  b;
    int8_t   c;
    int64_t  d;
};
```

BIT-ACCURATE-TRACING ANALYSIS WITH APPLIED MEMORY REGION LIFETIMES

BACKGROUND

Common classes of programming errors involve those that cause a thread to perform memory reads and/or writes beyond allocated memory (i.e., an out-of-bounds memory access). For example, one class of programming errors is caused by improper use of memory reserved by memory allocation functions. Many programming languages and/or libraries provide one or more memory allocation function calls (e.g., malloc( ) in the C Standard Library) that enable a process to request allocation of a block of memory of a specified size (e.g., from a pool of available memory, such as a heap), along with one or more memory deallocation function calls (e.g., free( ) in the C Standard Library) to later deallocate that memory. In general, memory allocation functions locate and reserve a contiguous block of available memory of the specified size from a memory pool, and return a pointer to a memory address at the beginning of the block. The thread can then access memory locations within this reserved block of memory based on integer offsets from that pointer. However, many programming languages may provide little to no protection against the thread actually accessing memory addresses outside of a reserved block. If a thread writes to memory outside of its reserved block, there is a risk that it could improperly overwrite valid memory values (e.g., values that are part of a different data structure and/or that are used by another thread). If a thread reads from memory outside of its reserved block, there is a risk that it could read unintended data (e.g., data from different data structure and/or that was written by another thread), read undefined data (e.g., a memory location that has not yet been written to), or cause an access violation by attempting to access inaccessible memory.

Another common class of programming errors involve those that cause a thread to improperly access memory from a memory location after its validity state has transitioned. For example, in many computer architectures each executing thread is associated with a memory region called a "stack," which stores temporary local information as the thread executes. In general, a new "stack frame" is added to the stack each time a function is called, and that function's stack frame is removed from the stack when the function terminates. Thus, the stack dynamically grows and shrinks during execution of the thread. Each stack frame allocates one or more memory locations for any of the function's local variables. These memory locations are "valid" for the function to use while the function executes, but become "invalid" for any function to use when the stack frame is removed from the stack. However, coding errors may result in accesses (reads and/or writes) to those memory locations even after the stack frame has been removed from the stack (and the memory locations have become invalid). Programming languages may provide little to no protection against the thread performing these types of improper stack-based memory accesses.

These types of improper memory accesses can be particularly difficult to locate and debug, since they may not actually cause a thread's execution to fail (fault) in all situations. As used herein, an improper memory access that causes a fault is one that causes an error (e.g., a segmentation fault, an access violation, an unhandled exception, etc.) that leads the thread's execution to terminate. This is in contrast to proper memory accesses that may cause events that are commonly termed "faults" (e.g., page faults), but that do not actually cause a thread's execution to terminate in error. A fault that causes execution to fail may occur when invalid data is read and relied upon and causes the execution to "derail" in some manner, or may occur when a thread accesses a memory location that it is not permitted to access or that does not actually correspond to a legal memory address. However, every access beyond allocated memory, or every access to memory that is no longer valid, will not necessarily cause one of these faults to occur. For example, even though a memory access may be improper, it may read valid data (e.g., data that the thread previously wrote and which was not subsequently overwritten), it may be to a memory location the thread is permitted to access, etc.

Thus, for the purposes of this specification, the term "non-faulting" is inclusive of page faults that are not errors (such as used in most virtual memory systems to allow memory to be "paged out" temporarily). Similarly, the term "execution faulting" (or variants thereof) is more restrictive by excluding non-error page faults, and is intended to cover faults that impact the ability to continue execution (e.g., access violations, segmentation faults, unhandled exceptions, and the like). Of course, the term "non-execution-faulting" (or variants thereof) thus indicates the inverse of "execution faulting".

Prior attempts have been made to locate improper non-faulting memory accesses—but they are not able to detect all of instances and adversely may alter program execution state. For example, one attempt is to use debuggers to set write breakpoints to observe each memory write, and manually determine if it is within bounds. However, this is tedious and is not practical to do on production software. Another attempt is to parse through memory dumps after a program has faulted, in order to try to determine its cause. However, this is again tedious and loses state.

Other prior attempts try to encourage some of these improper memory accesses to fault. For example, some tools insert memory page(s) within a thread's address space adjacent an allocated buffer (e.g., within the heap and/or after a thread's stack space), in which these page(s) comprise memory addresses that are not legal addresses or that the thread is not permitted to access. A fault (e.g., a segmentation fault, an access violation, etc.) will then occur if the thread tries to read too far beyond an allocated buffer and into one of these "guard pages." However, guard pages would only be able to detect the first class of programming errors (i.e., reading beyond an allocated buffer), and even then, guard pages cannot be used to detect all accesses beyond an allocated buffer. For example, there could still be memory locations the thread is permitted to access that exist between the allocated buffer and the guard page. These memory locations could include padding for memory alignment, other allocated buffers, etc. Another prior attempt to try to encourage improper memory accesses to fault involves pre-filling stack locations with a predefined arbitrary value, to increase the chance of causing a fault if the uninitialized value is read. However, pre-filling stack locations introduces additional execution overhead, and does not catch all uses of uninitialized values.

Further, recent developments in debugging technology have surrounded what is frequently referred to as "time travel" tracing (TTT). In general, TTT involves recording a bit-accurate trace of live execution of one or more threads of an application program, enabling a full and accurate replay of the prior execution of these thread(s) at later time. Thus, TTT enables creation of "time travel" debuggers, which are able to faithfully replay prior execution of one or more threads in both forward and reverse directions and perform other types of rich analysis.

BRIEF SUMMARY

At least some embodiments described herein apply bit-accurate tracing analysis of time travel traces to track the lifetime of memory regions that were actually used by a thread during its prior execution. In particular, embodiments use the tracked lifetime of memory regions to identify when the thread made non-faulting, but improper, access(es) to memory location(s) outside of allocated memory and/or when the thread made non-faulting, but improper, access(es) to memory location(s) as they transitioned between being valid and invalid. As such, embodiments can identify otherwise difficult-to-find programming errors that caused these non-faulting memory accesses to occur during a thread's prior execution.

Some embodiments detect non-faulting memory accesses during prior execution of an application, based on a replay-able trace of the application's execution. These embodiments include method, systems, and computer program products that replay one or more portions of prior execution of an application from a replay-able trace of execution of the application, while tracking lifetime of a memory region used by the application. Based on tracking lifetime of the memory region, one or more non-faulting memory accesses by the application during its prior execution are detected, and notification of the one or more non-faulting memory accesses are provided to a user interface or other component.

One example of a non-faulting memory access that could be detected includes a memory access by the application beyond a requested size of memory (e.g., beyond an allocated buffer). Another example includes a read by the application from a stack location after an ordered sequence of at least: (i) a write to the stack location while it was valid, (ii) the stack location being made invalid, and (iii) the stack location being made valid, and in which the stack location was not written to between the stack location being made valid and the read. Yet another example includes a read by the application from a stack location after an ordered sequence of at least: (i) the stack location being made valid, (ii) the stack location being made invalid, and (iii) the stack location being written to while invalid, and in which the stack location was not written to while being a valid stack location between the stack location being written to while invalid and the read. Yet another example includes a write by the application to a stack location after an ordered sequence of at least: (i) the stack location being made valid, and (ii) the stack location being made invalid, and in which the stack location is not valid at the time of the write.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION

At least some embodiments described herein apply bit-accurate tracing analysis of time travel traces to track the lifetime of memory regions that were actually used by a thread during its prior execution. In particular, embodiments use the tracked lifetime of memory regions to identify when the thread made non-faulting, but improper, access(es) to memory location(s) outside of allocated memory and/or when the thread made non-faulting, but improper, access(es) to memory location(s) as they transitioned between being valid and invalid. As such, embodiments can identify otherwise difficult-to-find programming errors that caused these non-faulting memory accesses to occur during a thread's prior execution.

Figure 1:
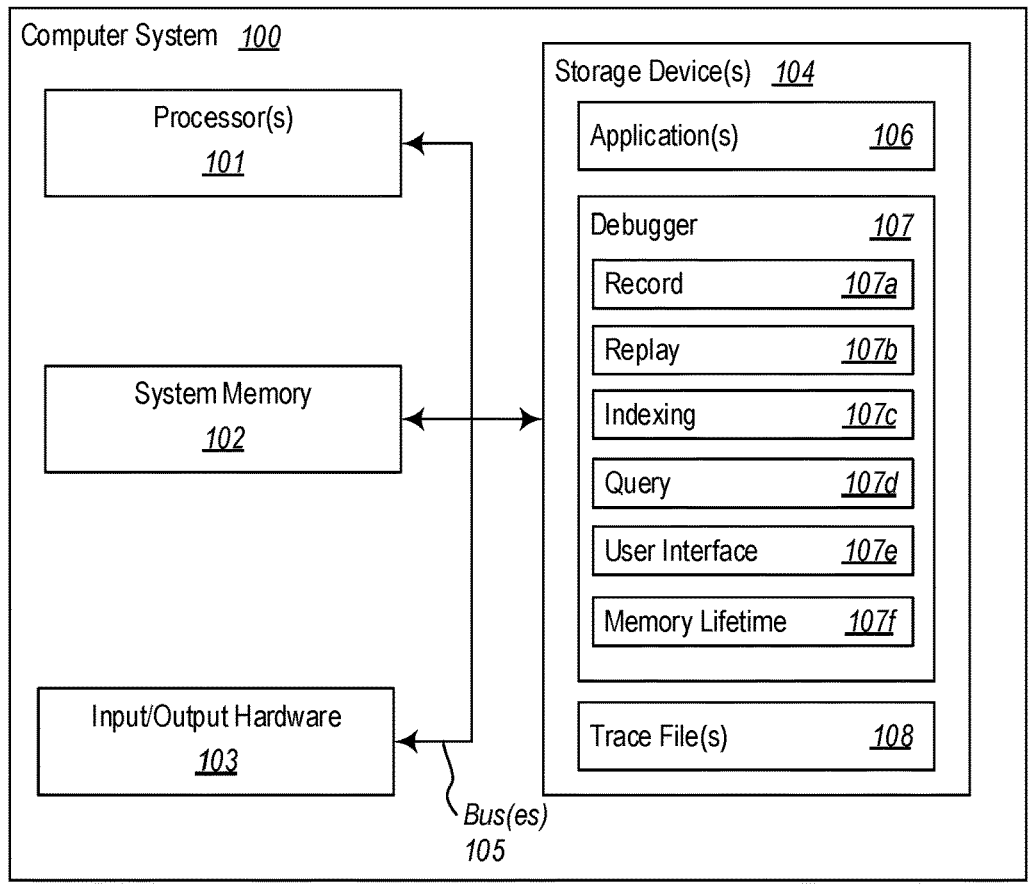
FIG. 1 illustrates an example computer system that facilitates applying bit-accurate tracing analysis of time travel traces in order to track the lifetime of memory regions that were actually used by a thread during its prior execution.

FIG. 1 illustrates an example computer system 100 that facilitates applying bit-accurate tracing analysis of time travel traces in order to track the lifetime of memory regions that were actually used by a thread during its prior execution. This enables the computer system 100 to locate the occurrence of non-faulting, yet improper, memory accesses during that prior execution of the thread, including identifying program code that caused the improper memory access. As depicted, embodiments may comprise or utilize a special-purpose or general-purpose computer system 100 that includes computer hardware, such as, for example, one or more processor(s) 101, system memory 102, input/output hardware 103 (e.g., user input hardware such as a keyboard, mouse, touchscreen, trackpad, etc.; networking hardware; display hardware; and the like), one or more storage device(s) 104, etc. that are communicatively interconnected by one or more bus(es) 105.

Embodiments within the scope of the present invention include physical and other computer-readable media for carrying or storing computer-executable instructions and/or data structures. Such computer-readable media can be any available media that can be accessed by the computer system 100. Computer-readable media that store computer-executable instructions and/or data structures are computer storage devices. Computer-readable media that carry computer-executable instructions and/or data structures are transmission media. Thus, by way of example, and not limitation, embodiments of the invention can comprise at least two distinctly different kinds of computer-readable media: computer storage devices and transmission media.

Computer storage devices are physical hardware devices that store computer-executable instructions and/or data structures. Computer storage devices include various computer hardware, such as RAM, ROM, EEPROM, solid state drives ("SSDs"), flash memory, phase-change memory ("PCM"), optical disk storage, magnetic disk storage or other magnetic storage devices, or any other hardware device(s) which can be used to store program code in the form of computer-executable instructions or data structures, and which can be accessed and executed by the computer system 100 and executed by the one or more processor(s) 101 to implement the disclosed functionality of the invention. Thus, for example, computer storage devices may include the depicted system memory 102, the depicted storage device(s) 104 which can store computer-executable instructions and/or data structures, or other storage such as cache memory on the one or more processor(s) 101.

Transmission media can include a network and/or data links which can be used to carry program code in the form of computer-executable instructions or data structures, and which can be accessed by the computer system 100. A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer system, the computer system may view the connection as transmission media. Combinations of the above should also be included within the scope of computer-readable media. For example, the input/output hardware 103 may comprise hardware (e.g., a network interface module (e.g., a "NIC")) that connects a network and/or data link which can be used to carry program code in the form of computer-executable instructions or data structures.

Further, upon reaching various computer system components, program code in the form of computer-executable instructions or data structures can be transferred automatically from transmission media to computer storage devices (or vice versa). For example, computer-executable instructions or data structures received over a network or data link can be buffered in RAM within a NIC (e.g., input/output hardware 103), and then eventually transferred to the system memory 102 and/or to less volatile computer storage devices (e.g., storage device(s) 104) at the computer system 100. Thus, it should be understood that computer storage devices can be included in computer system components that also (or even primarily) utilize transmission media.

Computer-executable instructions comprise, for example, instructions and data which, when executed at the processor(s) 101, cause the computer system 100 to perform a certain function or group of functions. Computer-executable instructions may be, for example, binaries, intermediate format instructions such as assembly language, or even source code.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, tablets, pagers, routers, switches, and the like. The invention may also be practiced in distributed system environments where local and remote computer systems, which are linked (either by hardwired data links, wireless data links, or by a combination of hardwired and wireless data links) through a network, both perform tasks. As such, in a distributed system environment, a computer system may include a plurality of constituent computer systems. In a distributed system environment, program modules may be located in both local and remote memory storage devices.

Those skilled in the art will also appreciate that the invention may be practiced in a cloud computing environment. Cloud computing environments may be distributed, although this is not required. When distributed, cloud computing environments may be distributed internationally within an organization and/or have components possessed across multiple organizations. In this description and the following claims, "cloud computing" is defined as a model for enabling on-demand network access to a shared pool of configurable computing resources (e.g., networks, servers, storage, applications, and services). The definition of "cloud computing" is not limited to any of the other numerous advantages that can be obtained from such a model when properly deployed.

A cloud computing model can be composed of various characteristics, such as on-demand self-service, broad network access, resource pooling, rapid elasticity, measured service, and so forth. A cloud computing model may also come in the form of various service models such as, for example, Software as a Service ("SaaS"), Platform as a Service ("PaaS"), and Infrastructure as a Service ("IaaS"). The cloud computing model may also be deployed using different deployment models such as private cloud, community cloud, public cloud, hybrid cloud, and so forth.

Some embodiments, such as a cloud computing environment, may comprise a system that includes one or more hosts that are each capable of running one or more virtual machines. During operation, virtual machines emulate an operational computing system, supporting an operating system and perhaps one or more other applications as well. In some embodiments, each host includes a hypervisor that emulates virtual resources for the virtual machines using physical resources that are abstracted from view of the virtual machines. The hypervisor also provides proper isolation between the virtual machines. Thus, from the perspective of any given virtual machine, the hypervisor provides the illusion that the virtual machine is interfacing with a physical resource, even though the virtual machine only interfaces with the appearance (e.g., a virtual resource) of a physical resource. Examples of physical resources including processing capacity, memory, disk space, network bandwidth, media drives, and so forth.

As illustrated, the storage device(s) 104 can store computer-executable instructions and/or data structures representing executable code such as, for example, one or more application program(s) 106 (e.g., a user-space application, an operating system kernel, a hypervisor, etc.), and a debugger 107. In general, one or more of the application(s) 106 may be subject of debugging by the debugger 107. When executable code is executing at the processor(s) 101, the system memory 102 can store corresponding runtime data, such as runtime data structures, computer-executable instructions, etc. The storage device(s) 104 can further store any type of data that can be created and/or consumed by the application(s) 106 and/or the debugger 107, such as one or more trace file(s) 108 that are created and/or consumed by the debugger 107.

The debugger 107 can include one or more of a variety of components (e.g., 107a-107f) for generating, replaying, and/or analyzing the trace file(s) 108 in connection with execution of application(s) 106. The particular identity and arrangement of components 107a-107f could vary depending on a particular configuration/deployment of the debugger 107. For example, if the debugger 107 includes a record component 107a, it includes functionality to record a bit-accurate trace of execution of application 106 and to store trace data in the trace file(s) 108. If the debugger 107 includes a replay component 107b, it includes functionality to replay a bit-accurate trace of execution of application 106 based on the trace data stored in the trace file(s) 108, thereby accurately reproducing that application's prior execution.

Notably, trace recording and trace reply need not occur at the same computer system. Thus, for example, a limited implementation of debugger 107 (e.g., including a subset of components 107a-107f, such as only record component 107a) could be deployed at a production computer system to record a trace of a production application's execution into trace file(s) 108, and a more extensive implementation of debugger 107 (e.g., including all of components 107a-107f) could be deployed at a development computer system 100 for performing replay/debugging of the production application's execution based on the recorded trace file(s) 108.

As mentioned, the record component 107a is usable to record a bit-accurate trace of execution of an application 106 into a trace file 108. Different implementations of bit-accurate trace recording exist, and the embodiments herein for applying bit-accurate tracing analysis of time travel traces in order to track the lifetime of memory regions that were actually used by a thread during its prior execution are not limited to a particular bit-accurate trace recording mechanism.

As an example, implementations of a record component 107a may record sufficient data to be able to reproduce the influx of information into cache memory of the processor(s) 101 during execution of an application's thread(s). A first approach to doing this is to record all of the data brought into the cache for a thread's execution by logging all cache misses and un-cached reads (i.e., reads from hardware components and un-cacheable memory) cause by the thread, along with a time during execution at which each piece of data was brought into the cache (e.g., using a count of instructions executed or some other counter). A second approach may track and record only the cache lines that were "consumed" by each processing unit in the processor(s) 101 (e.g., a processing unit may be considered to have "consumed" a cache line when it is aware of its present value). A processing unit may have "consumed" a cache line because it is the one that wrote the present value of the cache line, or because the processing unit performed a read on the cache line. This second approach may involve extending the processor's cache (e.g., by adding one or more bits per cache line) that enable the processor 101 to identify, for each cache line, one or more processing units that consumed the cache line. A third approach may utilize the processor's cache coherence protocol to determine a subset of "consumed" cache lines to record in the file(s) 108, and which will still enable activity of the shared cache to be reproduced. Other approaches exist, each with their own benefits and drawbacks (e.g., trace recording overhead, trace file size, multi-thread capabilities, etc.).

Regardless of the recording strategy employed by the record component 107a, some implementations may record one or more trace data streams into the trace file(s) 108. In some implementations, each trace data stream corresponds to a different thread. For example, the trace file(s) 108 could include a separate trace data stream for each individual processing unit (e.g., each logical processor core) that executes a thread of the application 106. In other implementations, each trace data stream corresponds to multiple threads. For example, the trace file(s) 108 could include a separate trace data stream for related processing units (e.g., a data stream for each processor socket). In some implementations, data packets for each individual processing unit are recorded independent of data packets for other processing units, enabling different threads that executed at the different processing units to be replayed independently. The trace file(s) 108 can, however, include some information—whether it be express or inherent—that provides a partial ordering among the different threads. For example, some embodiments may use monotonically-incrementing numbers to record an ordering of certain "orderable" events (e.g., accesses to shared memory) across all threads.

The replay component 107b consumes the trace file(s) 108 to replay the recorded execution of application(s) 106. For example, the replay component 107b may supply code of a traced application with recorded values obtained from the trace file(s) 108 at appropriate times in order to cause that code to execute in the same manner that it did during trace recording. The data obtained during replay can then be used to present execution state (e.g., using user interface component 107f) and/or to be the basis of trace analysis.

If included, the indexing component 107c processes the trace file(s) 108 in order to produce traces that are optimized for performant replay, searching, querying, etc. For example, during recording, the record component 107a may record the trace data streams in a manner that emphasizes low tracing overhead and/or small trace file size, but which may not be optimal for performant replay or querying. The indexing component 107c can then process these recorded traces in order to produce new optimized trace data streams, and/or metadata annotating the recorded trace data streams, for replay. Examples of optimizations can include, for example, insertion of key frames (which enable replay to be initiated starting at the key frame) at regular intervals, at interesting locations such as function boundaries or insertion, etc.; insertion of memory snapshots summarizing memory locations and/or values that were encountered during sections of a trace; insertion of reverse-lookup data structures for quickly identifying trace attributes; etc. Indexing may include static analysis of the trace, and/or performing trace replay with the replay component 107b to obtain relevant data.

If included, the query component 107d can be used to perform searches (e.g., keywords and/or natural language phrases) over the trace files to produce ranked results, and/or to perform queries (e.g., structured expressions) over the trace files. These searches/queries can be used during debugging to locate the occurrence of a variety of interesting events during the traced application's execution, such as functions called, transitions to kernel mode, exceptions encountered, memory addresses accessed, memory values read, etc.

The user interface component 107e provides a user interface for performing trace recording with the record component 107a, for performing trace indexing with indexing component 107c, and/or for performing trace replay/debugging with the replay component 107b and potentially other components (e.g., 107d-107f)). In some embodiments, the user interface component 107f provides a user interface for facilitating user interactions with the debugger 107, such as browsing application code, stepping through code execution in forward and reverse directions, setting forward and reverse watchpoints/breakpoints, for performing searches/queries using the query component 107d, initiating and configuring indexing with the indexing component 107c, etc.

The memory lifetime component 107f performs analysis of trace files(s) 108 to track the lifetime of memory regions that were actually used by a thread during its prior execution. This enables the debugger to identify when the thread(s) made non-faulting, but improper, memory accesses outside of an active memory lifetime, such as accesses to memory locations outside of allocated memory, improper accesses to memory locations as they transitioned between being valid and invalid, etc. Thus, the memory lifetime component 107f can identify otherwise difficult-to-find programming errors that caused these non-faulting memory accesses to occur during the thread's prior execution.

In some embodiments, the memory lifetime component 107f can work in concert with other components of the debugger 107. For example, the memory lifetime component 107f might initiate replay of trace portions with the replay component 107c in order to observe memory access behaviors, might cooperate with the indexing component 107c to add memory lifetime indexing information to the trace file(s) 108, might be utilized by the query component 107d to supply memory lifetime information as a result of a search/query, etc.

Figure 2:
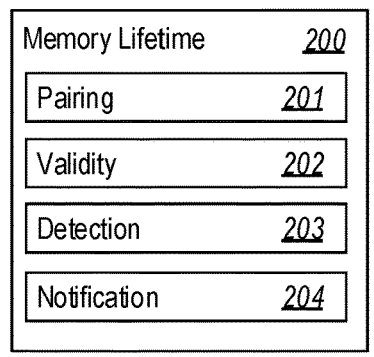
FIG. 2 illustrates an example memory lifetime component.

To facilitate further understanding of memory lifetime tracking, FIG. 2 further illustrates a detailed memory lifetime component 200, which could correspond to memory lifetime component 107f of FIG. 1. Example sub-components of the memory lifetime component 200 can include a pairing component 201, a validity component 202, a detection component 203, and a notification component 204.

In general, the pairing component 201 pairs observed memory "allocations" with observed memory "deallocations" in order to identify the lifetime(s) of memory location(s) affected by the allocation/deallocation and, by extension, whether a given memory access to those memory location(s) is proper at a given time. The particular definition of an "allocation" or "deallocation" can vary based on context. For example, an "allocation" could correspond to an express call to allocation functionality (e.g., the malloc( ) function in the C Standard Library, the new keyword in C++, etc.) and a "deallocation" could correspond to an express call to deallocation functionality (e.g., the free( ) function in the C Standard Library, the delete keyword in C++, etc.). In another example, an "allocation" could correspond to the addition of a stack frame (including allocation of space for local variables) to a thread's stack, and a "deallocation" could correspond to removal of that stack frame (e.g., upon completion of a function). As such, the pairing component 201 may be able to understand a broad set of memory-related functions in order to pair allocations and deallocations.

In some embodiments, the pairing component 201 is extended to track triplets of related allocation and deallocation functions. For example, the C Standard Library provides the realloc( ) function, which is used to change the allocated size of memory previously allocated by calling malloc( ). Thus, pairing component 201 can track memory region lifetime with triplets, such as a call to malloc( ) then a call to realloc( ) then a call to free( ). In some embodiments, the pairing component 201 could treat a call to realloc( ) as a call to malloc( ) to obtain a memory region of the newly requested size, then a call to free( ) to deallocation the previously allocated memory, and then a re-initialization of only those bytes that were allocated by the original call to malloc( ). This re-initialization is demonstrated later in connection with FIG. 4. Other programming languages provide similar reallocation functionality, and as such the embodiments herein are not limited to the C programming language. For example, some managed programming languages use runtimes that include compacting garbage collectors (GC's) that could be viewed as operating based on reallocation functions, and implementations of the pairing component 201 can track lifetime of memory regions affected by these GC's (e.g., by tracking these reallocations).

Using the lifetime information identified by the pairing component 201, the validity component 202 can apply one of three classifications relevant memory locations at a given time during the thread's prior execution: (i) the location was invalid (i.e., it did not correspond to any active lifetime at the given time), (ii) the location was valid (i.e., it corresponded to an active lifetime at the given time) but its contents were undefined at that given time), or (iii) the location was valid at the given time and had valid (i.e., defined) contents a that given time. As the thread executed, a given memory location may have transitioned between these states at various points in execution. The validity component 202 can replay the trace file(s) 108 to identify these transitions.

The detection component 203 detects when the thread performed a non-faulting memory access on a memory location at a time when the location was invalid for an active lifetime, or at a time when the memory location was valid for the active lifetime but had undefined contents for the active lifetime. These are likely improper memory accesses, even though they didn't cause a fault. Examples of these types of accesses are given later.

The notification component 204 provides notification of a non-faulting memory access identified by the detection component 203. Notification could be given to any appropriate component, such as the user interface component 107e, the indexing component 107c, the query component 107d, a debugger 107 at another computer system, or even an application other than the debugger 107 at this or another computer system.

In one non-limiting example, the validity component 202 could place memory breakpoints on all invalid memory regions and/or memory locations. The breakpoints could then be updated by cooperation of the pairing component 201 and the validity component 202 as memory is allocated and deallocated. If one of these breakpoints is encountered during replay, the detection component 203 could detect an invalid memory access, and notify the notification component 204.

Notably, since the memory lifetime component 200 operates on a bit-accurate trace of execution, it may be able to identify the bounds of memory allocations—and thus non-faulting improper memory accesses—without the need for compiler symbols. This enables memory lifetime analysis to be performed even if source code is not available to the debugger 107 (i.e., when only compiled binaries are available). For non-stack-based allocations, for example, bit-accurate traces may provide sufficient information to identify the allocation and deallocation functions used (e.g., based on information about library exports). For stack-based allocations, on the other hand, if the stack frame was allocated using one instruction per local variable the debugger 107 could identify variables based on which direct stack memory accesses the code performed. For example, since local variables are accessed as offsets to known pointers (e.g., as offsets from a stack pointer or a frame pointer), they can be located by these accesses. Accesses to structs or functions can further be identified indirectly—e.g., as and offset to an address that was itself obtained via an offset to a stack pointer or a frame pointer. If the allocation of a stack frame was performed with a single instruction, however, additional heuristics may be used to identify these allocations. However, the memory lifetime component 200 can utilize symbols, if available, to provide additional information such as function names, variable names, etc.; to render more precise results; and/or to reduce the amount or complexity of heuristics performed.

In combination with the query component 107d, the memory lifetime component 200 can provide rich functionality for locating coding errors that caused non-faulting but improper memory accesses. For example, search or queries could be constructed that could identify each non-faulting access, and the code that caused each to occur.

Figure 3A:
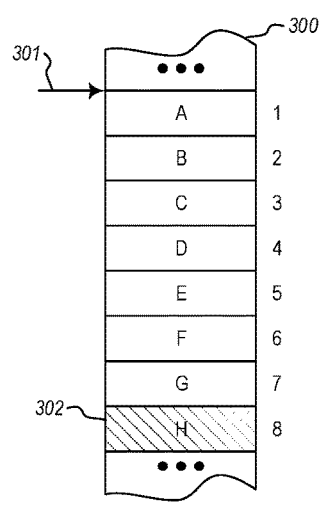
FIG. 3A illustrates an example memory allocation that could result from a thread's call to an allocation function.

FIGS. 3A-6 illustrate some particular examples of how lifetime analysis of a bit-accurate trace can be used to identify non-faulting and improper memory accesses. Initially, FIGS. 3A and 3B illustrates an example in which a non-faulting memory access could occur when the memory access is beyond an allocated buffer, such as a buffer allocated from heap memory by an allocation function. These non-faulting memory access are extremely difficult to identify using prior debugging tools, but are readily identified using the memory lifetime component 200 as part of an analysis of a bit accurate trace.

In particular, FIG. 3A illustrates a memory allocation 300 that could result from a thread's request for a block of seven bytes (e.g., a call to malloc(7) using the C Standard Library, or a similar call in another programming language). In particular, memory allocation 300 shows memory range including seven bytes starting at memory address 301. As such, a call to the allocation function might return memory address 301 to the thread, and the thread can then use integer offsets from this address to access the allocated memory (bytes 1-7). For example, FIG. 3A shows data A-G are written to these seven bytes.

In addition to this allocation of seven bytes, FIG. 3A also shows that the memory allocation 300 could also include an eighth "padding" byte 302. The allocation function may have reserved this padding byte 302 to facilitate memory alignment (e.g., 8- or 16-byte memory alignment) in order to speed memory accesses based on characteristics of the physical memory and/or memory bus. This padding byte 302 is technically not allocated to the thread that requested the seven-byte allocation (and thus it is not part of the allocation's lifetime). However, since the allocation function would typically not use this byte for any other requested memory allocation while memory allocation 300 is active, the thread might improperly use this eighth byte to store and read data without causing any faults. For example, FIG. 3A shows that the thread has improperly written a value (i.e., H) to the padding byte 302.

Figure 3B:
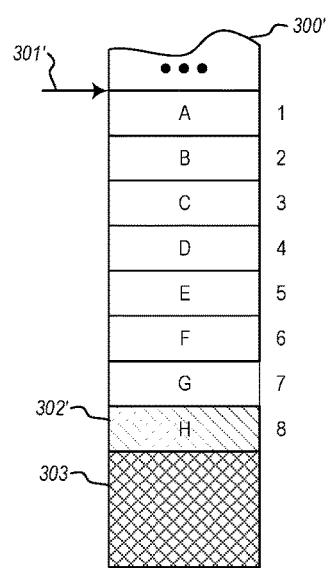
FIG. 3B illustrates an example memory allocation that could result from a thread's call to an allocation function, including a guard page.

The thread might improperly use this eighth byte to store and read data without causing any faults, even if the allocation function placed a non-mapped guard page adjacent to the memory allocation 300. For example, FIG. 3B depicts a memory allocation 300' which corresponds to memory allocation 300 FIG. 3A, but includes a guard 303. Despite the existence of the guard 303, memory allocation 300' still includes a padding byte 302' that could be used by the thread without causing an access violation.

The memory lifetime component 200 can identify these improper accesses to the padding byte 302/302' by determining that memory location of the padding byte 302/302' was invalid at the time of the accesses (e.g., using the validity component 202). The location is invalid because it is not part of any active lifetime, as determined by the paring component 201.

While the thread may execute properly while accessing this eight byte in the particular situation of FIG. 3A, the thread's out-of-bounds use of memory could cause intermittent (and even random) execution errors/faults that are difficult to reproduce because the amount of padding may not always be the same and/or the extent of the out-of-bounds memory access may not always be the same. Suppose, for instance, that the requested buffer size in a call to malloc( ) is based on a variable. In the situation of FIG. 3A the value of this variable was seven, and thus one byte of padding was added to the allocated buffer. However, if this variable had a different value the size of the padding may have been larger (e.g., if the variable had a value between one and six), or the padding might even have been eliminated (e.g., if the variable had a value of eight, sixteen, etc.). The amount of padding could also vary due to software environment (e.g., the compiler or compiler settings used; the operating system, operating system version, or operating system settings used; the libraries or library versions used; etc.), the hardware environment the program is compiled for, the relative alignment of the allocated buffer with other buffers (e.g., the exact ordering and size of prior memory allocations), etc. Furthermore, the offset from the base address of the memory allocation (e.g., memory address 301) that is used for memory accesses could be based on a variable, leading to variability as to whether or not memory accesses are out-of-bounds, and/or the extent of out-of-bounds memory accesses (i.e., how many bytes after the allocated buffer are actually accessed). Thus, depending on the variability in padding and the extent of the out-of-bounds memory access(es), the exact execution state that actually leads to an error/fault may be rare and difficult to reproduce, making the coding error(s) causing the out-of-bounds access extremely difficult to locate using conventional techniques.

Figure 4:
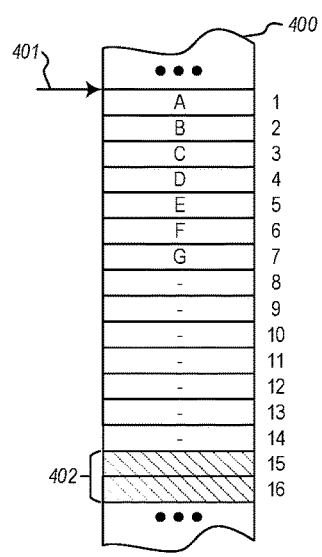
FIG. 4 illustrates an example memory allocation that could result from a thread's call to a reallocation function.

Further complications can arise if a thread performs a reallocation. For example, FIG. 4 illustrates a memory allocation 400 that might result from the thread calling for a reallocation of 14 bytes based on pointer 301 (e.g., using a call realloc( ) using the C standard library, or a similar function in another programming language). In most situations, the memory allocation 400 would be made from a different portion of memory than allocation 300. As such, pointer 401 to beginning memory address of memory allocation 400 would typically be to a different address that pointer 301. Since this is a different chunk of memory, the reallocation function would typically copy the contents of memory allocation 300 to memory allocation 400, but only those addresses that were actually allocated by the original allocation function. Thus, as shown in FIG. 4, the value H from padding byte 302 would typically not be copied to memory allocation 400. Thus, if the thread relied on the contents at byte 8 of memory allocation 400, it would likely read a value other than H. By detecting the memory access that wrote the value H to the padding byte 302/302' was improper, the memory lifetime component can also determine that a read from byte 8 of memory allocation 400 reads undefined data. As further shown in FIG. 4, memory allocation 400 could also include padding bytes 402 to ensure byte-alignment. Thus, memory allocation 400 also includes potential locations that the thread could write to and/or read from beyond the allocated buffer without faulting.

In some embodiments, the memory lifetime 200 component could detect other types of accesses beyond an allocated buffer. For example, some allocation functions may use memory before and/or after the allocated buffer as a header or footer to store bookkeeping information about the allocation. The memory lifetime 200 component could use knowledge of how these allocation functions works (e.g., the different ways in which they can be called, and how they treat the headers/footers based on the type of call) to further identify any memory locations that are part of a header/footer. Then, memory lifetime 200 component could treat memory accesses to these headers/footers as invalid.

Figure 5A:
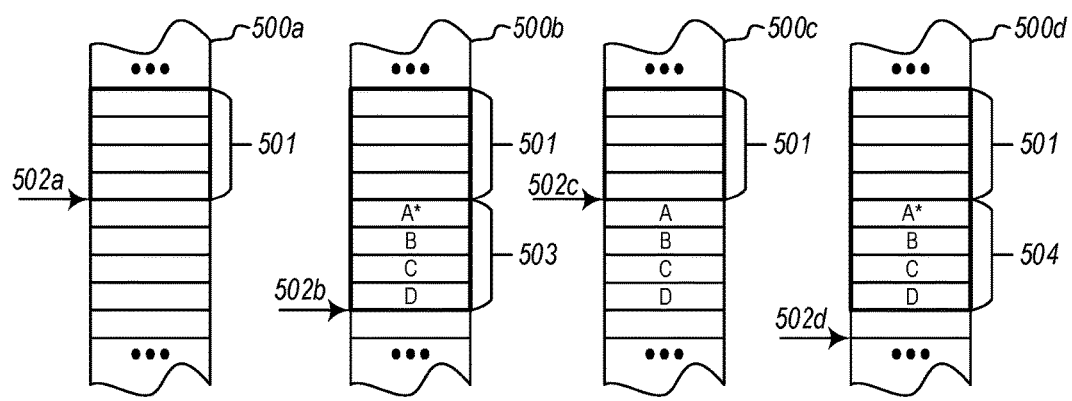
FIG. 5A illustrates an example of a first set of stack states that could occur during execution of a thread.
Figure 5B:
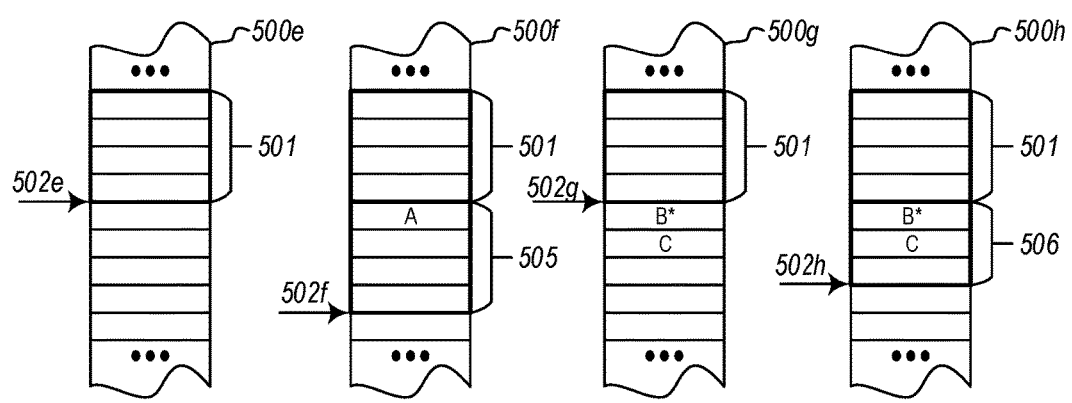
FIG. 5B illustrates an example of a second set of stack states that could occur during execution of a thread.

While FIGS. 3A, 3B, and 4 focused on identifying improper memory accesses around buffer allocations (such as from a heap), FIGS. 5A and 5B illustrate examples of improper stack memory accesses that could be readily identified using the memory lifetime component 200 as part of an analysis of a bit accurate trace. For example, FIG. 5A illustrates several stack states 500a-500d that could occur during execution of a thread. Initially, at state 500a, a thread's stack includes a stack frame 501, and a stack pointer 502a pointing to the last entry in the stack. Below this stack frame 501 are memory locations that are not valid for the lifetime of stack frame 501 at state 500a.

Next at state 500b, a new stack frame 503 has been added, with the stack pointer 502b now pointing to the last entry in stack frame 503. Stack frame 503 could have been added, for example, due to the thread calling a function. Stack frame 503 includes four memory locations containing content A, B, C, and D; these memory locations could have been allocated at the creation of the stack frame 503 for local variables of the function that was called. These values could then have been written by the function after their allocation. These locations became valid upon creation of the stack frame, and as such the memory accesses that wrote these values were valid since they occurred during a lifetime of the stack frame 503.

Next, at state 500c, the stack frame 503 has been removed, and the stack pointer 502c again points the last entry in stack frame 501. Stack frame 503 could have been removed, for example, due to completion of the function that had created stack frame 503. Since stack frame 503 has been removed, the memory locations that were previously part of the stack frame are now invalid, and the stack frame's lifetime has ended. However, as shown, the values that were written to stack fame 503 by the function may still exist in those memory locations.

Finally, at state 500d, another stack frame 504 has been added, with the stack pointer 502d now pointing to the last entry in stack frame 504. Stack frame 504 could have been added, for example, due to the thread calling the same function again. In stack frame 504, the four memory locations that have become valid locations again. However, at this point in execution, none of these memory locations have been written to by the new call to the function. Thus, they are valid memory locations, but they contain undefined values with respect to the lifetime of stack frame 504.

If there is a coding error, however, the thread might read from one or more of these memory locations prior to the current function writing to it. Thus, of example if the thread read the first location (as indicated by the asterisk) it would read the value A that was placed in that location by the prior instance of the function. This thread would be reading from a valid memory location, but it would read invalid data so far as the lifetime of stack frame 504 is concerned. In many cases, the function may actually execute without fault, even though the read was improper. However, the memory lifetime component 200 may detect this invalid memory access due tracking the lifetimes of stack frames 503 and/or 504.

FIG. 5B illustrates an alternate set of stack states 500e-500f that could occur during execution of a thread. Initially, at state 500e, a thread's stack includes a stack frame 501, and a stack pointer 502e pointing to the last entry in the stack. Below this stack frame 501 are memory locations that are not valid for the lifetime of stack frame 501 at state 500e.

Next at state 500f, a new stack frame 505 has been added, with the stack pointer 502f now pointing to the last entry in stack frame 505. Stack frame 505 could have been added, for example, due to the thread calling a function. Stack frame 505 includes four memory locations; these memory locations could have been allocated at the creation of the stack frame 505 for local variables of the function that was called. These memory locations might then be written to by the function after their allocation. For example, FIG. 5B shows that the first memory location has been written to with the value A, while the other locations have not yet been written to. These four memory locations became valid upon creation of the stack frame 505, and as such any memory accesses that write to these locations while the stack frame is active are valid, since they occur during a lifetime of the stack frame 505.

Next, at state 500g, the stack frame 505 has been removed, and the stack pointer 502g again points the last entry in stack frame 501. Stack frame 505 could have been removed, for example, due to completion of the function that had created stack frame 505. Since stack frame 505 has been removed, the memory locations that were previously part of the stack frame are now invalid, and its lifetime has ended. At state 500g, however, the first two of these locations have been written to (i.e., the values B and C). These writes could have occurred, for example, due to a coding errors that caused improper writes by the function corresponding to stack frame 501 beyond its stack frame. Nonetheless, these writes might proceed without fault in many situations. In addition, the function corresponding to stack frame 501 might also read from one or more of these locations (e.g., the first location containing value B, as indicated by the asterisk). Again, this read is improper, but might proceed without fault in many situations. However, the memory lifetime component 200 may detect this invalid memory access due tracking the lifetime of stack frame 505.

Additionally, at state 500h, another stack frame 506 has been added, with the stack pointer 502h now pointing to the last entry in stack frame 506. Stack frame 506 could have been added, for example, due to the thread calling some other function. In stack frame 506, there are three memory locations that have become valid locations. While two of these locations contain the values written at state 500g (i.e., B and C), these are undefined values with respect to the lifetime of stack frame 506. If there is a coding error, however, the thread might read from one or more of these memory locations prior to the current function writing to it. Thus, of example if the thread read the first location (as indicated by the asterisk) it would read the value B that was improperly placed in that location by the prior function. This thread would be reading from a valid memory location, but it would read invalid data so far as the lifetime of stack frame 506 is concerned. In some cases, the function may actually execute without fault, even though the read was improper.

However, the memory lifetime component 200 may detect this invalid memory access due tracking the lifetime of stack frames 505 and/or 506.

Figures 6A, 6B:
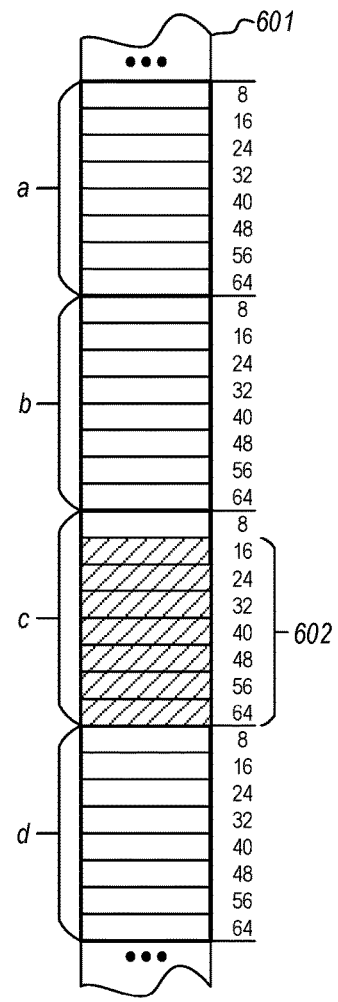
FIG. 6A illustrates an example "struct" primitive definition.
FIG. 6B illustrates an example memory allocation that might be reserved based on the "struct" primitive definition of FIG. 6A.

Other types of memory allocations, including stack-based allocations, could also provide opportunities for code access memory beyond an allocated buffer. For example, FIG. 6A includes an example C-style "struct" primitive 600 (A) that includes three 64-bit integers (i.e., a, b, and d) and one 8-bit integer (i.e., c). FIG. 6B illustrates an example memory allocation 601 that might be allocated on a thread's stack based on struct primitive 600. In particular, FIG. 6B shows that a contemporary compiler might reserve 64-bit memory ranges for each of integers a, b, c, and d. As shown, however, the 64-bit memory range for integer c includes 8-bits for the integer itself, followed by 56-bits of padding 602. Similar to the padding discussed in FIGS. 3A, 3B, and 4, padding 602 might be added by the compiler in order to align the variables on 64-bit boundaries, but it is not actually allocated for use by the struct primitive. However, coding errors may result in values being read and/or written within the 56-bit padding 602. Since this memory is not reserved for any other purpose, these errors may not result in a fault or other execution error. However, by applying lifetime analysis to the memory locations in memory layout 601 as they relate to the struct primitive, the memory lifetime component 200 can determine that the memory locations corresponding to the 56-bit padding 602 are not "valid" and thus accesses to these memory locations are improper.

Figure 7:
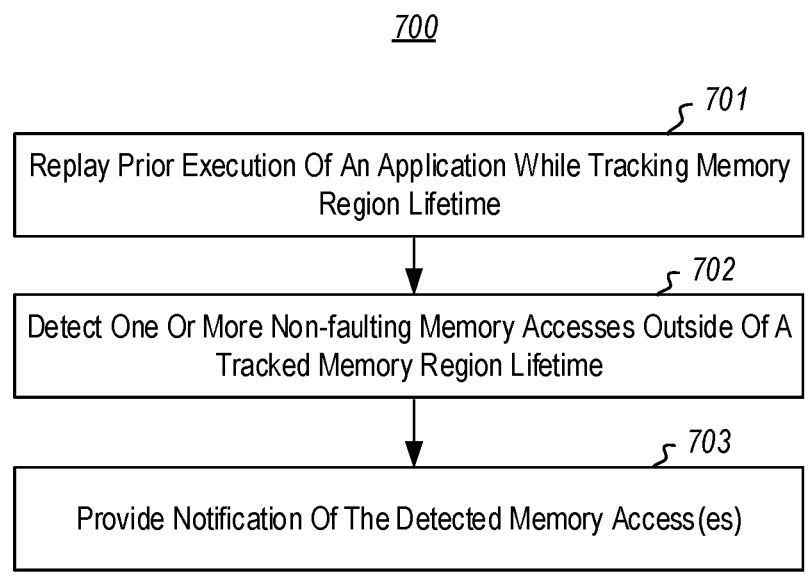
FIG. 7 illustrates a flow chart of an example method for detecting non-faulting memory accesses during prior execution of an application, based on a replay-able trace of the application's execution.

In view of the foregoing computing environments and examples, FIG. 7 illustrates a flow chart of an example method 700 for detecting non-faulting memory accesses during prior execution of an application, based on a replay-able trace of the application's execution. Method 700 will be described with respect to the components and data of computer system 100, the memory lifetime component 200 of FIG. 2, and the examples of FIGS. 3A-6B.

Method 700 comprises an act 701 of replaying prior execution of an application while tracking memory region lifetime. Act 701 can include replaying one or more portions of prior execution of an application from a replay-able trace of execution of the application, while tracking lifetime of a memory region used by the application. For example, the computer system 100 can use the replay component 107b of debugger 107 to replay prior execution of one of application(s) 106 based on trace file(s) 109. Prior execution of the application could have been recorded to the trace file(s) 109 by a record component 107a at computer system 100, or at another computer system. Trace file(s) 109 contain enough information to store a bit-accurate trace of that application's prior execution. As such, the replay component 107b is able to faithfully reproduce actions performed by that application during its prior execution, including faithfully reproducing memory accesses performed by the application—including the values it read from memory.

In connection with the replay, the debugger 107 can use the memory lifetime component 107f (i.e., memory lifetime component 200) in order to track lifetime of one or more memory regions that were used by the application 106 as it executed. In particular, the memory lifetime component 200 includes a pairing component 201 that can track when lifetime of a memory region begins (e.g., due to an allocation function, the addition of a stack frame, instantiation of a struct, etc.) and when the lifetime ends (e.g., due to a deallocation function, the removal of a stack frame, the removal of a struct, etc.) Additionally, the memory lifetime component 200 can track fairly complex lifetimes, such as those that involved use of reallocation functions.

Based on the lifetime(s) tracked by the memory lifetime component 200, the validity component 202 can determine the validity state of memory locations at different times. As mentioned, validity states could include invalid, valid as to location and contents, or valid as to location but invalid as to contents. The validity component 202 can track various transitions in validity for a memory location, since the validity of a memory location could have changed as the application 106 executed due to the coming and going of memory region lifetimes.

Method 700 also comprises an act 702 of detecting one or more non-faulting memory accesses outside of a tracked memory region lifetime. Act 702 can include based on tracking lifetime of the memory region, detecting one or more non-faulting memory accesses by the application during its prior execution. For example, based on the lifetime(s) tracked by the pairing component 201 and the validity tracked by the validity component 202, the detection component 203 can detect a non-faulting memory access that was improper since it was an access to a memory location when the location was invalid, or an access to the location when its contents were invalid (i.e., undefined or invalid for the active lifetime of the location).

Examples of different non-faulting memory accesses that could be detected in act 702 are demonstrated in FIGS. 3A-6B. For example, a non-faulting memory access could be a memory access by the application beyond a requested size of allocated memory. This is demonstrated in FIGS. 3A, 3B, and 4, in which the access could be an access to a padding byte 302, 302', or 402 after a requested heap memory allocation or reallocation. This is also demonstrated in FIG. 6, in which the access could be to a padding byte 602 within a stack-based allocation, such as a struct.

In another example, a non-faulting memory access could be a read by the application from a stack location after an ordered sequence of at least: (i) a write to the stack location while it was valid, (ii) the stack location being made invalid, and (iii) the stack location being made valid, and in which the stack location was not written to between the stack location being made valid and the read. This is demonstrated in FIG. 5A, in which the access is a read from a memory location (i.e., the first location in stack frame 504 during state 500d, containing the value A) after the location was (i) written to while the location was valid (i.e., the write of the value A to the first location of stack frame 503 at state 500b), (ii) made invalid (i.e., the removal of stack frame 503 at state 500c) and (iii) made valid again (i.e., the addition of stack frame 504 at state 500d). Notably, in FIG. 5A, there was no write to this location in either of states 500c or 500d, leading to the value "A" being read. Thus, while the memory location was valid for the lifetime of stack frame 504 in state 500d, its contents were not valid for the lifetime of stack frame 504—rendering the memory access improper.

In another example, a non-faulting memory access could be a read by the application from a stack location after an ordered sequence of at least: (i) the stack location being made valid, (ii) the stack location being made invalid, and (iii) the stack location being written to while invalid, and in which the stack location was not written to while being a valid stack location between the stack location being written to while invalid and the read. This is demonstrated in FIG. 5B, in which the access is a read from a memory location (e.g., a read of the value B from the first location following stack frame 501, either at state 500g or state 500h) after the location was (i) made valid and potentially written to (i.e., the addition of stack frame 505 at state 500f, and potentially written to with the value of A), (ii) made invalid (i.e., the removal of stack frame 505 at state 500g) and (iii) being written to while invalid (i.e., the write of the value B at state 500g). If a read is performed from that location at state 500g it is improper and out-of-bounds due to the location being invalid (i.e., not part of any active lifetime), or if a read is performed from that location at state 500h prior to it being written to in state 500h it is improper due to the location containing invalid contents for the lifetime of stack frame 506.

In yet another example, a non-faulting memory access could be a write by the application to a stack location after an ordered sequence of at least: (i) the stack location being made valid, and (ii) the stack location being made invalid, and in which the stack location is not valid at the time of the write. This is also demonstrated in FIG. 5B, in which the access is a write to a memory location (e.g., one of the writes at state 500g, writing the value B or C) after the location was (i) made valid and potentially written to (i.e., the addition of stack frame 505 at state 500f, and potentially written to with the value of A), (ii) and then made invalid (i.e., the removal of stack frame 505 at state 500g). If one or more of these writes of values B and/or C are performed on that location at state 500g, they improper and out-of-bounds due to the location being invalid (i.e., not part of any active lifetime).

Method 700 also comprises an act 703 of providing notification of the detected memory access(es). Act 703 can include providing notification of the one or more non-faulting memory accesses. For example, the notification component 204 provide the user interface component 107e with notification of the non-faulting memory access(es) for display at a user interface. Alternatively, the notification component 204 could notify any other appropriate component, such as the indexing component 107c, the query component 107d, or some other software application.

Accordingly, embodiments herein apply bit-accurate tracing analysis of time travel traces to track the lifetime of memory regions that were actually used by a thread during its prior execution. These embodiments use the tracked lifetime of memory regions to identify when the thread made non-faulting, but improper, access(es) to memory location(s) outside of allocated memory and/or when the thread made non-faulting, but improper, access(es) to memory location(s) as they transitioned between being valid and invalid. As such, embodiments can identify otherwise difficult-to-find programming errors that caused these non-faulting memory accesses to occur during a thread's prior execution.

Although the subject matter has been described in language specific to structural features and/or methodological acts, it is to be understood that the subject matter defined in the appended claims is not necessarily limited to the described features or acts described above, or the order of the acts described above. Rather, the described features and acts are disclosed as example forms of implementing the claims.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed:

1. A method, implemented at a computer system that includes at least one processor, for detecting non-faulting memory accesses during prior execution of an application, based on a replay-able trace of the application's execution, the method comprising:
   replaying one or more portions of prior execution of an application from a replay-able trace of execution of the application, while tracking lifetime of a memory region used by the application;
   based on tracking lifetime of the memory region, detecting one or more non-faulting memory accesses by the application during a prior execution of the application, including one or more of:
      a memory access by the application beyond a requested size of allocated memory, and wherein the non-faulting memory access comprises a read from a memory location not copied by a reallocation function;
      a first read by the application from a first stack location after an ordered sequence of at least: (i) a write to the first stack location while the first stack location was valid, (ii) the first stack location being made invalid, and (iii) the first stack location being made valid, and in which the first stack location was not written to between the first stack location being made valid and the first read; or
      a second read by the application from a second stack location after an ordered sequence of at least: (i) the second stack location being made valid, (ii) the second stack location being made invalid, and (iii) the second stack location being written to while invalid, and in which the second stack location was not written to while being a valid stack location between the second stack location being written to while invalid and the second read, the second stack location having been written to between the second stack location being made valid and the second stack location being made invalid; and
   providing notification of the one or more non-faulting memory accesses.

2. The method as recited in claim 1, further comprising detecting one or more addtional non-faulting memory accesses that comprise a read or a write to a memory location allocated as memory alignment padding that follows a buffer for the requested size of memory.

3. The method as recited in claim 1, wherein the one or more non-faulting memory accesses comprise the memory access by the application beyond a requested size of allocated memory.

4. The method as recited in claim 1, wherein the one or more non-faulting memory accesses comprise the first read by the application.

5. The method as recited in claim 1, wherein the one or more non-faulting memory accesses comprise the second read by the application.

6. The method as recited in claim 1, wherein the one or more non-faulting memory accesses comprise the memory access by the application beyond a requested size of allocated memory, and wherein the requested size of allocated memory is requested by a call to a memory allocation or a reallocation function.

7. The method as recited in claim 1, further comprising detecting one or more additional non-faulting memory accesses that comprise a read or a write to at least one of (i) a memory location allocated as memory alignment padding, or (ii) an allocation header or footer.

8. A method, implemented at a computer system that includes at least one processor, for detecting non-faulting memory accesses during prior execution of an application, based on a replay-able trace of the application's execution, the method comprising:
  replaying one or more portions of prior execution of an application from a replay-able trace of execution of the application, while tracking lifetime of a memory region used by the application;
  based on tracking lifetime of the memory region, detecting one or more non-faulting memory accesses by the application during a prior execution of the application, including one or more of:
    a first read by the application from a first stack location after an ordered sequence of at least: (i) a write to the first stack location while the first stack location was valid, (ii) the first stack location being made invalid, and (iii) the first stack location being made valid, and in which the first stack location was not written to between the first stack location being made valid and the first read;
    a second read by the application from a second stack location after an ordered sequence of at least: (i) the second stack location being made valid, (ii) the second stack location being made invalid, and (iii) the second stack location being written to while invalid, and in which the second stack location was not written to while being a valid stack location between the second stack location being written to while invalid and the second read; or
    a first write by the application to a third stack location after an ordered sequence of at least: (i) the third stack location being made valid, and (ii) the third stack location being made invalid, and in which the third stack location is not valid at the time of the first write,
  wherein, for the first read, the second read, and the first write, each of the first stack location, the second stack location, and the third stack location comprises a variable local to a function; and
  providing notification of the one or more non-faulting memory accesses.

9. The method as recited in claim 8, wherein the one or more non-faulting memory accesses comprise the first read by the application.

10. The method as recited in claim 8, wherein the one or more non-faulting memory accesses comprise the second read by the application.

11. The method as recited in claim 8, wherein the one or more non-faulting memory accesses comprise the first write by the application.

12. The method as recited in claim 8, further comprising detecting one or more additional non-faulting memory accesses that comprise a memory access by the application beyond a requested size of allocated memory, and wherein the requested size of allocated memory is requested by a call to a memory allocation or a reallocation function.

13. The method as recited in claim 8, further comprising detecting one or more additional non-faulting memory accesses that comprise a read or a write to at least one of (i) a memory location allocated as memory alignment padding, or (ii) an allocation header or footer.

14. A method, implemented at a computer system that includes at least one processor, for detecting non-faulting memory accesses during prior execution of an application, based on a replay-able trace of the application's execution, the method comprising:
  replaying one or more portions of prior execution of an application from a replay-able trace of execution of the application, while tracking lifetime of a memory region used by the application;
  based on tracking lifetime of the memory region, detecting one or more non-faulting memory accesses by the application during a prior execution of the application, including one or more of:
    a first read by the application from a first stack location after an ordered sequence of at least: (i) a write to the first stack location while the first stack location was valid, (ii) the first stack location being made invalid, and (iii) the first stack location being made valid, and in which the first stack location was not written to between the first stack location being made valid and the first read;
    a second read by the application from a second stack location after an ordered sequence of at least: (i) the second stack location being made valid, (ii) the second stack location being made invalid, and (iii) the second stack location being written to while invalid, and in which the second stack location was not written to while being a valid stack location between the second stack location being written to while invalid and the second read; or
    a first write by the application to a third stack location after an ordered sequence of at least: (i) the third stack location being made valid, and (ii) the third stack location being made invalid, and in which the third stack location is not valid at the time of the first write,
  wherein, for the first read, the second read, and the first write:
    each of the making invalid the first stack location, the making invalid the second stack location, and the making invalid the third stack location comprises removal of a first stack frame from the application's stack, and
    each of the making valid the first stack location, the making valid the second stack location, and the making valid the third stack location comprises addition of a second stack frame to the application's stack; and
  providing notification of the one or more non-faulting memory accesses.

15. The method as recited in claim 14, wherein the one or more non-faulting memory accesses comprise the first read by the application.

16. The method as recited in claim 14, wherein the one or more non-faulting memory accesses comprise the second read by the application.

17. The method as recited in claim 14, wherein the one or more non-faulting memory accesses comprise the first write by the application.

18. The method as recited in claim 14, further comprising detecting one or more additional non-faulting memory accesses that comprise a memory access by the application beyond a requested size of allocated memory, and wherein the requested size of allocated memory is requested by a call to a memory allocation or a reallocation function.

19. The method as recited in claim 14, further comprising detecting one or more additional non-faulting memory accesses that comprise a read or a write to at least one of (i) a memory location allocated as memory alignment padding, or (ii) an allocation header or footer.

20. A computer program product comprising one or more hardware storage devices having stored thereon computer-executable instructions that are executable by one or more processors to detect non-faulting memory accesses during prior execution of an application, based on a replay-able trace of the application's execution, the computer-executable instructions being executable to cause the one or more processors to perform at least the following:
- replay one or more portions of prior execution of an application from a replay-able trace of execution of the application, while tracking lifetime of a memory region used by the application;
- based on tracking lifetime of the memory region, detect one or more non-faulting memory accesses by the application during a prior execution of the application, including one or more of:
  - a memory access by the application beyond a requested size of allocated memory, and wherein the non-faulting memory access comprises a read from a memory location not copied by a reallocation function;
  - a first read by the application from a first stack location after an ordered sequence of at least: (i) a write to the first stack location while the first stack location was valid, (ii) the first stack location being made invalid, and (iii) the first stack location being made valid, and in which the first stack location was not written to between the first stack location being made valid and the first read; or
  - a second read by the application from a second stack location after an ordered sequence of at least: (i) the second stack location being made valid, (ii) the second stack location being made invalid, and (iii) the second stack location being written to while invalid, and in which the second stack location was not written to while being a valid stack location between the second stack location being written to while invalid and the second read, the second stack location having been written to between the second stack location being made valid and the second stack location being made invalid; and
- provide notification of the one or more non-faulting memory accesses.

21. The computer program product as recited in claim 20, wherein the one or more non-faulting memory accesses comprise the memory access by the application beyond a requested size of allocated memory.

22. The computer program product as recited in claim 20, wherein the one or more non-faulting memory accesses comprise the first read by the application.

23. The computer program product as recited in claim 20, wherein the one or more non-faulting memory accesses comprise the second read by the application.

24. The computer program product as recited in claim 20, wherein the one or more non-faulting memory accesses comprise the memory access by the application beyond a requested size of allocated memory, and wherein the requested size of allocated memory is requested by a call to a memory allocation or a reallocation function.

25. The computer program product as recited in claim 20, wherein the computer-executable instructions are executable to also detect one or more additional non-faulting memory accesses that comprise a read or a write to at least one of (i) a memory location allocated as memory alignment padding, or (ii) an allocation header or footer.

26. A computer program product comprising one or more hardware storage devices having stored thereon computer-executable instructions that are executable by one or more processors to detect non-faulting memory accesses during prior execution of an application, based on a replay-able trace of the application's execution, the computer-executable instructions being executable to cause the one or more processors to perform at least the following:
- replay one or more portions of prior execution of an application from a replay-able trace of execution of the application, while tracking lifetime of a memory region used by the application;
- based on tracking lifetime of the memory region, detect one or more non-faulting memory accesses by the application during a prior execution of the application, including one or more of:
  - a first read by the application from a first stack location after an ordered sequence of at least: (i) a write to the first stack location while the first stack location was valid, (ii) the first stack location being made invalid, and (iii) the first stack location being made valid, and in which the first stack location was not written to between the first stack location being made valid and the first read;
  - a second read by the application from a second stack location after an ordered sequence of at least: (i) the second stack location being made valid, (ii) the second stack location being made invalid, and (iii) the second stack location being written to while invalid, and in which the second stack location was not written to while being a valid stack location between the second stack location being written to while invalid and the second read; or
  - a first write by the application to a third stack location after an ordered sequence of at least: (i) the third stack location being made valid, and (ii) the third stack location being made invalid, and in which the third stack location is not valid at the time of the first write,
  - wherein, for the first read, the second read, and the first write, each of the first stack location, the second stack location, and the third stack location comprises a variable local to a function; and
- provide notification of the one or more non-faulting memory accesses.

27. The computer program product as recited in claim 26, wherein the one or more non-faulting memory accesses comprise the first read by the application.

28. The computer program product as recited in claim 26, wherein the one or more non-faulting memory accesses comprise the second read by the application.

29. The computer program product as recited in claim 26, wherein the one or more non-faulting memory accesses comprise the first write by the application.

30. The computer program product as recited in claim 26, wherein the computer-executable instructions are executable to also detect one or more additional non-faulting memory accesses that comprise a memory access by the application beyond a requested size of allocated memory, and wherein the requested size of allocated memory is requested by a call to a memory allocation or a reallocation function.

31. The computer program product as recited in claim 26, wherein the computer-executable instructions are executable to also detect one or more additional non-faulting memory accesses that comprise a read or a write to at least one of (i) a memory location allocated as memory alignment padding, or (ii) an allocation header or footer.

32. A computer program product comprising one or more hardware storage devices having stored thereon computer-executable instructions that are executable by one or more processors to detect non-faulting memory accesses during prior execution of an application, based on a replay-able trace of the application's execution, the computer-executable instructions being executable to cause the one or more processors to perform at least the following:
  replay one or more portions of prior execution of an application from a replay-able trace of execution of the application, while tracking lifetime of a memory region used by the application;
  based on tracking lifetime of the memory region, detect one or more non-faulting memory accesses by the application during a prior execution of the application, including one or more of:
    a first read by the application from a first stack location after an ordered sequence of at least: (i) a write to the first stack location while the first stack location was valid, (ii) the first stack location being made invalid, and (iii) the first stack location being made valid, and in which the first stack location was not written to between the first stack location being made valid and the first read;
    a second read by the application from a second stack location after an ordered sequence of at least: (i) the second stack location being made valid, (ii) the second stack location being made invalid, and (iii) the second stack location being written to while invalid, and in which the second stack location was not written to while being a valid stack location between the second stack location being written to while invalid and the second read; or
    a first write by the application to a third stack location after an ordered sequence of at least: (i) the third stack location being made valid, and (ii) the third stack location being made invalid, and in which the third stack location is not valid at the time of the first write,
  wherein, for the first read, the second read, and the first write:
    each of the making invalid the first stack location, the making invalid the second stack location, and the making invalid the third stack location comprises removal of a first stack frame from the application's stack, and
    each of the making valid the first stack location, the making valid the second stack location, and the making valid the third stack location comprises addition of a second stack frame to the application's stack; and
  provide notification of the one or more non-faulting memory accesses.

33. The computer program product as recited in claim 32, wherein the one or more non-faulting memory accesses comprise the first read by the application.

34. The computer program product as recited in claim 32, wherein the one or more non-faulting memory accesses comprise the second read by the application.

35. The computer program product as recited in claim 32, wherein the one or more non-faulting memory accesses comprise the first write by the application.

36. The computer program product as recited in claim 32, wherein the computer-executable instructions are executable to also detect one or more additional non-faulting memory accesses that comprise a memory access by the application beyond a requested size of allocated memory, and wherein the requested size of allocated memory is requested by a call to a memory allocation or a reallocation function.

37. The computer program product as recited in claim 32, wherein the computer-executable instructions are executable to also detect one or more additional non-faulting memory accesses that comprise a read or a write to at least one of (i) a memory location allocated as memory alignment padding, or (ii) an allocation header or footer.

38. A computer system, comprising:
  one or more processors; and
  one or more computer-readable media having stored thereon computer-executable instructions that are executable by the one or more processors to detect non-faulting memory accesses during prior execution of an application, based on a replay-able trace of the application's execution, the computer-executable instructions being executable to cause the computer system to perform at least the following:
    replay one or more portions of prior execution of an application from a replay-able trace of execution of the application, while tracking lifetime of a memory region used by the application;
    based on tracking lifetime of the memory region, detect one or more non-faulting memory accesses by the application during a prior execution of the application, including one or more of:
      a memory access by the application beyond a requested size of allocated memory, and wherein the non-faulting memory access comprises a read from a memory location not copied by a reallocation function;
      a first read by the application from a first stack location after an ordered sequence of at least: (i) a write to the first stack location while the first stack location was valid, (ii) the first stack location being made invalid, and (iii) the first stack location being made valid, and in which the first stack location was not written to between the first stack location being made valid and the first read; or
      a second read by the application from a second stack location after an ordered sequence of at least: (i) the second stack location being made valid, (ii) the second stack location being made invalid, and (iii) the second stack location being written to while invalid, and in which the second stack location was not written to while being a valid stack location between the second stack location being written to while invalid and the second read, the second stack location having been written to between the second stack location being made valid and the second stack location being made invalid; and
    provide notification of the one or more non-faulting memory accesses.

39. The computer system as recited in claim 38, wherein providing notification of the one or more non-faulting memory accesses comprises one or more of (i) presenting a user interface notification, or (ii) notifying a software component.

40. The computer system as recited in claim 38, wherein the one or more non-faulting memory accesses comprise the memory access by the application beyond a requested size of allocated memory, and wherein the requested size of allocated memory is requested by a call to a memory allocation or a reallocation function.

41. The computer system as recited in claim 38, wherein tracking lifetime of the memory region used by the application comprises pairing allocation and deallocation functions.

42. The computer system as recited in claim 38, wherein tracking lifetime of the memory region used by the application comprises tracking memory affected by stack frame additions and removals.

43. The computer system as recited in claim 38, wherein providing notification of the one or more non-faulting memory accesses comprises providing the notification in response to a search or query expression at a debugger.

44. The computer system as recited in claim 38, wherein the computer-executable instructions are executable to also detect one or more additional non-faulting memory accesses that comprise a read or a write to at least one of (i) a memory location allocated as memory alignment padding, or (ii) an allocation header or footer.

45. The computer system as recited in claim 38, wherein the computer-executable instructions are executable to also detect one or more additional non-faulting memory accesses that comprise a read or a write to a memory location allocated as memory alignment padding.

46. The computer system as recited in claim 38, wherein the one or more non-faulting memory accesses comprise a read or a write within an allocation header or footer.

47. The computer system as recited in claim 38, wherein the one or more non-faulting memory accesses comprise the memory access by the application beyond a requested size of allocated memory.

48. The computer system as recited in claim 38, wherein the one or more non-faulting memory accesses comprise the first read by the application.

49. The computer system as recited in claim 38, wherein the one or more non-faulting memory accesses comprise the second read by the application.

50. A computer system, comprising:
one or more processors; and
one or more computer-readable media having stored thereon computer-executable instructions that are executable by the one or more processors to detect non-faulting memory accesses during prior execution of an application, based on a replay-able trace of the application's execution, the computer-executable instructions being executable to cause the computer system to perform at least the following:
replay one or more portions of prior execution of an application from a replay-able trace of execution of the application, while tracking lifetime of a memory region used by the application;
based on tracking lifetime of the memory region, detect one or more non-faulting memory accesses by the application during a prior execution of the application, including one or more of:
a first read by the application from a first stack location after an ordered sequence of at least: (i) a write to the first stack location while the first stack location was valid, (ii) the first stack location being made invalid, and (iii) the first stack location being made valid, and in which the first stack location was not written to between the first stack location being made valid and the first read;
a second read by the application from a second stack location after an ordered sequence of at least: (i) the second stack location being made valid, (ii) the second stack location being made invalid, and (iii) the second stack location being written to while invalid, and in which the second stack location was not written to while being a valid stack location between the second stack location being written to while invalid and the second read; or a first write by the application to a third stack location after an ordered sequence of at least: (i) the third stack location being made valid, and (ii) the third stack location being made invalid, and in which the third stack location is not valid at the time of the first write,
wherein, for the first read, the second read, and the first write, each of the first stack location, the second stack location, and the third stack location comprises a variable local to a function; and
provide notification of the one or more non-faulting memory accesses.

51. The computer system as recited in claim 50, wherein the one or more non-faulting memory accesses comprise the first read by the application.

52. The computer system as recited in claim 50, wherein the one or more non-faulting memory accesses comprise the second read by the application.

53. The computer system as recited in claim 50, wherein the one or more non-faulting memory accesses comprise the first write by the application.

54. The computer system as recited in claim 50, wherein the computer-executable instructions are executable to also detect one or more additional non-faulting memory accesses that comprise a memory access by the application beyond a requested size of allocated memory, and wherein the requested size of allocated memory is requested by a call to a memory allocation or a reallocation function.

55. The computer system as recited in claim 50, wherein the computer-executable instructions are executable to also detect one or more additional non-faulting memory accesses that comprise a read or a write to at least one of (i) a memory location allocated as memory alignment padding, or (ii) an allocation header or footer.

56. A computer system, comprising:
one or more processors; and
one or more computer-readable media having stored thereon computer-executable instructions that are executable by the one or more processors to detect non-faulting memory accesses during prior execution of an application, based on a replay-able trace of the application's execution, the computer-executable instructions being executable to cause the computer system to perform at least the following:
replay one or more portions of prior execution of an application from a replay-able trace of execution of the application, while tracking lifetime of a memory region used by the application;
based on tracking lifetime of the memory region, detect one or more non-faulting memory accesses by the application during a prior execution of the application, including one or more of:
a first read by the application from a first stack location after an ordered sequence of at least: (i) a write to the first stack location while the first stack location was valid, (ii) the first stack location being made invalid, and (iii) the first stack location being made valid, and in which the first stack location was not written to between the first stack location being made valid and the first read;
a second read by the application from a second stack location after an ordered sequence of at least: (i) the second stack location being made valid, (ii) the second stack location being made invalid, and (iii) the second stack location being written to while invalid, and in which the second stack location was not written to while being a valid stack location between the second stack location being written to while invalid and the second read; or a first write by the application to a third stack location after an ordered sequence of at least: (i) the third stack location being made valid, and (ii) the third stack location being made invalid, and in which the third stack location is not valid at the time of the first write, wherein, for the first read, the second read, and the first write:

each of the making invalid the first stack location, the making invalid the second stack location, and the making invalid the third stack location comprises removal of a first stack frame from the application's stack, and each of the making valid the first stack location, the making valid the second stack location, and the making valid the third stack location comprises addition of a second stack frame to the application's stack; and provide notification of the one or more non-faulting memory accesses.

57. The computer system as recited in claim 56, wherein the one or more non-faulting memory accesses comprise the first read by the application.

58. The computer system as recited in claim 56, wherein the one or more non-faulting memory accesses comprise the second read by the application.

59. The computer system as recited in claim 56, wherein the one or more non-faulting memory accesses comprise the first write by the application.

60. The computer system as recited in claim 56, wherein the computer-executable instructions are executable to also detect one or more additional non-faulting memory accesses that comprise a memory access by the application beyond a requested size of allocated memory, and wherein the requested size of allocated memory is requested by a call to a memory allocation or a reallocation function.

61. The computer system as recited in claim 56, wherein the computer-executable instructions are executable to also detect one or more additional non-faulting memory accesses that comprise a read or a write to at least one of (i) a memory location allocated as memory alignment padding, or (ii) an allocation header or footer.

* * * * *